United States Patent
Ochiai

(10) Patent No.: US 7,511,320 B2
(45) Date of Patent: Mar. 31, 2009

(54) SEMICONDUCTOR DEVICE AND MANUFACTURING METHOD OF THE SAME

(75) Inventor: Isao Ochiai, Ota (JP)

(73) Assignees: Sanyo Electric Co., Ltd., Osaka (JP); Kanto Sanyo Semiconductor Co., Ltd., Gunma (JP)

(*) Notice: Subject to any disclaimer, the term of this patent is extended or adjusted under 35 U.S.C. 154(b) by 709 days.

(21) Appl. No.: 11/111,999

(22) Filed: Apr. 22, 2005

(65) Prior Publication Data

US 2005/0248030 A1    Nov. 10, 2005

(30) Foreign Application Priority Data

Apr. 27, 2004    (JP) ............................. 2004-130676

(51) Int. Cl.
H01L 27/148    (2006.01)
H01L 29/768    (2006.01)
H01L 23/02    (2006.01)
H01L 23/34    (2006.01)

(52) U.S. Cl. .................... 257/243; 257/306; 257/670; 257/717; 438/107; 438/108

(58) Field of Classification Search ................ 257/670, 257/717, 306, 243; 438/107, 108
See application file for complete search history.

(56) References Cited

U.S. PATENT DOCUMENTS

| 6,498,389 B1 | 12/2002 | Kim |
| 6,847,066 B2 | 1/2005 | Tahara et al. |

FOREIGN PATENT DOCUMENTS

| JP | 2003-309221 | 10/2003 |
| KR | 2001-0055255 | 7/2001 |
| KR | 2003-0006844 | 1/2003 |

Primary Examiner—Howard Weiss
Assistant Examiner—Steven H Rao
(74) Attorney, Agent, or Firm—Morrison & Foerster LLP

(57) ABSTRACT

The invention is directed to an improvement of reliability in a chip-size package type semiconductor device and a manufacturing method thereof. A semiconductor substrate formed with a pad electrode is prepared, and a first protection layer formed of epoxy resin is formed on a front surface of the semiconductor substrate. Then, a via hole is formed from a back surface of the semiconductor substrate to the pad electrode. A wiring layer is then formed from the via hole of the semiconductor substrate, being electrically connected with the pad electrode through the via hole. Then, a second protection layer and a conductive terminal are formed, and the semiconductor substrate is separated into individual semiconductor dies by dicing.

8 Claims, 3 Drawing Sheets

SEMICONDUCTOR DEVICE AND MANUFACTURING METHOD OF THE SAME

CROSS-REFERENCE OF THE INVENTION

This invention is based on Japanese Patent Application No. 2004-130676, the content of which is incorporated by reference in its entirety.

BACKGROUND OF THE INVENTION

1. Field of the Invention

The invention relates to a semiconductor device and a manufacturing method thereof, particularly to a package type semiconductor device and a manufacturing method thereof.

2. Description of the Related Art

CSP (Chip Size Package) has been pursued as a package type semiconductor device. The CSP means a small package having almost the same outside dimensions as those of a semiconductor die packaged in it.

Conventionally, a BGA (Ball Grid Array) type semiconductor device has been known as a kind of CSP. In this BGA type semiconductor device, a plurality of ball-shaped conductive terminals made of a metal such as solder is arrayed in a grid pattern on one surface of the package, and electrically connected with the semiconductor die mounted on the other side of the package. A manufacturing method of the BGA type semiconductor device of the conventional art will be described with reference to drawings next. FIG. 6 is a cross-sectional view showing the manufacturing method of the semiconductor device of the conventional art. FIG. 7 is a cross-sectional view showing the semiconductor device and the manufacturing method thereof of the conventional art.

First, as shown in FIG. 6, a pad electrode 51 is formed on a front surface of a semiconductor substrate 50 formed with an electronic device (not shown), extending from the electronic device. A support substrate 60 is further formed on the front surface of the semiconductor substrate 50. This support substrate 60 is made of, for example, a silicon substrate, a glass substrate, a ceramic substrate, or a metal substrate, supporting the semiconductor substrate 50 and preventing the semiconductor substrate 50 from cracking or warping. Then, a back surface of the semiconductor substrate 50 supported by the support substrate 60 is ground. The semiconductor substrate 50 is thinned to have a predetermined thickness by this backgrinding process.

Then, the semiconductor substrate 50 is formed with a via hole 52 penetrating from its back surface to the pad electrode 51. A wiring layer 53 is formed in the via hole 52, being electrically connected with the pad electrode 51. Between the semiconductor substrate 50 and the wiring layer 53, an insulation film (not shown) is formed. A protection layer 54 is formed on the wiring layer 53 so as to partially expose the wiring layer 53. On the exposed wiring layer 53, a conductive terminal 55 is formed, which can be connected with an external printed circuit board and so on.

Next, as shown in FIG. 7, dicing is performed along a dicing line (not shown) to separate the semiconductor substrate 50 into semiconductor dies 50A. Then, the support substrate 60 attached to the front surface of the semiconductor die 50A is peeled off or removed, thereby completing the package type semiconductor device. The relevant technology is disclosed in the Japanese Patent Application Publication No. 2003-309221.

In the manufacturing method of the package type semiconductor device described above, however, the support substrate 60 used for supporting the semiconductor substrate 50 in the backgrinding process or the forming process of the via hole 52 need be removed from the semiconductor die 50A after the processes. This causes a problem of making a manufacturing method of the semiconductor device complex and increasing a manufacturing cost.

Furthermore, on the front surface of the semiconductor device after the support substrate 60 is removed, the semiconductor die 50A is not sufficiently protected (from moisture permeation from outside and the like). This causes a problem of decreasing reliability of the semiconductor die. Alternatively, the front surface of the semiconductor die 50A (or the semiconductor substrate 50) is processed again for protecting the semiconductor die 50A. This causes a problem of making the manufacturing method complex and increasing the manufacturing cost.

SUMMARY OF THE INVENTION

The Invention provides a semiconductor device that includes a semiconductor die having a first surface and second surface, and a pad electrode formed on the first surface. A via hole is formed between the pad electrode and the second surface. The device also includes a first protection layer attached to the first surface so as to cover the pad electrode, an insulation film disposed on an inside wall of the via hole, and a metal portion disposed in the via hole to be in contact with the pad electrode.

The invention also provides a method of manufacturing a semiconductor device. The method includes providing a semiconductor substrate having a first surface and a second surface and including a pad electrode formed on the first surface, forming a first protection layer on the first surface to cover the pad electrode, forming a via hole from the second surface to reach the pad electrode, forming an insulation film on a sidewall of the via hole, and filling at least partially the via hole having the insulation film with a metal so that the metal is contact with the pad electrode, and cutting the semiconductor substrate so as to produce a semiconductor device having a corresponding portion of the first protection layer as a protection element of the semiconductor device.

DETAILED DESCRIPTION OF THE INVENTION

A manufacturing method of a semiconductor device of an embodiment of this invention will be described in detail with reference to drawings. FIGS. 1 to 5 are cross-sectional views showing the manufacturing method of the semiconductor device of the embodiment. It is noted that FIGS. 1 to 5 show a portion near a dicing line (not shown) in a semiconductor substrate forming the semiconductor device.

Figure 1:
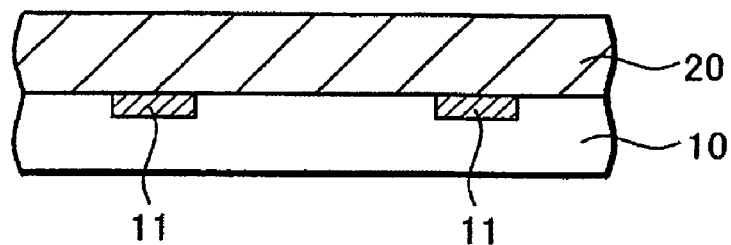
FIG. 1 is a cross-sectional view showing a manufacturing method of a semiconductor device of an embodiment of the invention.

First, a semiconductor substrate 10 formed with an electronic device (not shown) is prepared as shown in FIG. 1. The electronic device (not shown) is formed on a front surface of the semiconductor substrate 10. A pad electrode 11 is formed on the front surface of the semiconductor substrate 10, extending from the electronic device (not shown), which is also formed on the front surface of the semiconductor substrate 10. The pad electrode 11 is covered with a passivation film (not shown) made of silicon nitride or the like.

A first protection layer 20 is formed over the front surface of the semiconductor substrate 10 including on the electronic device (not shown) and on the pad electrode 11. The first protection layer 20 has a function of protecting the front surface of the semiconductor substrate 10 including the electronic device (not shown) and the pad electrode 11 and supporting the semiconductor substrate 10. The first protection layer 20 has a predetermined thickness that can support the semiconductor substrate 10. Although the predetermined thickness of the first protection layer 20 is not limited particularly, it is preferable to have the same thickness or substantially the same thickness as that of the semiconductor substrate 10. Alternatively, the predetermined thickness can be the thickness that can support the semiconductor substrate 10 after a backgrinding process described below is performed to a back surface of the semiconductor substrate 10.

The first protection layer 20 is formed by coating epoxy resin, for example, so as to have the predetermined thickness. The first protection layer 20 can be formed of any material besides the epoxy resin even if the material is transparent, semi-transparent, or opaque, as long as the material can protect the front surface of the semiconductor substrate 10 including the electronic device (not shown) and the pad electrode 11 and support the semiconductor substrate 10.

For example, the first protection layer 20 can be formed of a material of a resist layer used for patterning and the like in a general manufacturing method of a semiconductor device. In this case, the first protection layer 20 and the resist layer can be formed of the same material. This enables the formation of the first protection layer 20 without making a manufacturing process complex and with minimizing a manufacturing cost.

Figure 2:
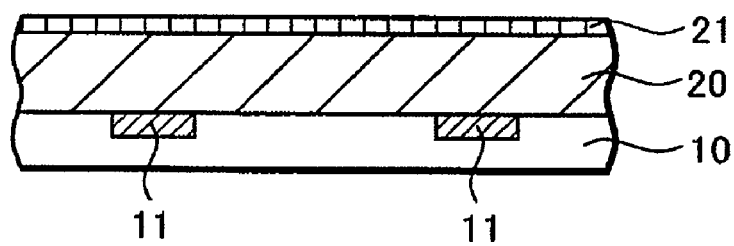
FIG. 2 is a cross-sectional view showing the manufacturing method of the semiconductor device of the embodiment of the invention.

Next, a protection tape 21 formed of a conductive material is attached to the front surface of the first protection layer 20 as shown in FIG. 2. This protection tape 21 is provided for keeping the semiconductor substrate 10 on a conveying device (not shown) such as an electrostatic chuck by electrostatic attachment when the semiconductor substrate 10 is moved or inverted by the conveying device (not shown). The protection tape 21 can be omitted when the semiconductor substrate 10 is moved or inverted by a mechanical conveying device such as a clamper.

Figure 3:
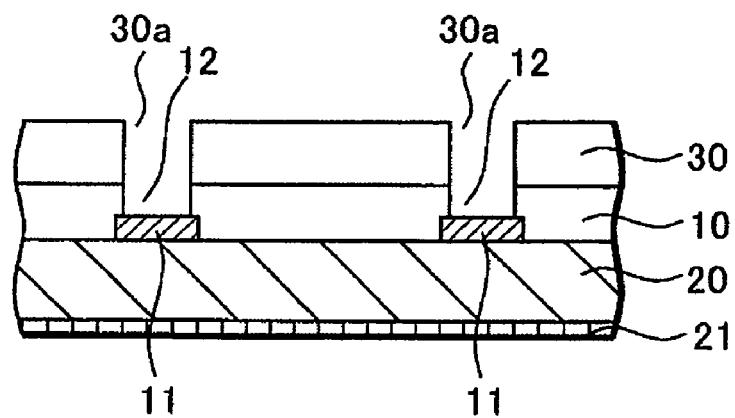
FIG. 3 is a cross-sectional view showing the manufacturing method of the semiconductor device of the embodiment of the invention.

Then, by the conveying device (not shown), the front and back surfaces of the semiconductor substrate 10 are inverted so that a process can be performed to the back surface of the semiconductor substrate 10, as shown in FIG. 3. Then, the back surface of the semiconductor substrate 10 is ground to have a predetermined thickness. That is, the backgrinding process is performed. In this process, since the semiconductor substrate 10 is protected and supported by the first protection layer 20 formed on the front surface thereof, cracking or warping of the semiconductor substrate 10 can be minimized even in a case where the thickness of the semiconductor substrate 10 is 130 μm or less, for example, when the backgrinding process is performed thereto. Furthermore, deterioration of electric characteristics of the electronic device (not shown) formed on the front surface of the semiconductor substrate 10 can be minimized.

Next, a resist layer 30 is formed on the back surface of the semiconductor substrate 10. The resist layer 30 has an opening 30a on a part of the back surface of the semiconductor substrate 10 corresponding to the pad electrode 11. Then, the semiconductor substrate 10 is etched using this resist layer 30 as a mask. By this process, a via hole 12 is formed penetrating the semiconductor substrate 10 from its back surface to the pad electrode 11.

Figure 4:
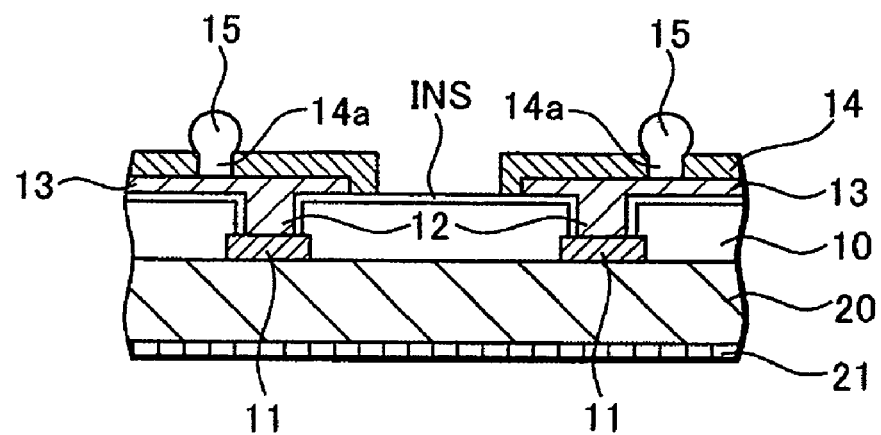
FIG. 4 is a cross-sectional view showing the manufacturing method of the semiconductor device of the embodiment of the invention.

Then, an oxide film INS is formed on a sidewall of the via hole 12 and on the back surface of the semiconductor substrate 10, exposing a bottom portion of the via hole 12, as shown in FIG. 4. Then, a wiring layer 13 formed of, for example, metal such as Cu (copper) is formed on a region from the via hole 12 to the back surface of the semiconductor substrate 10. This wiring layer 13 is electrically connected with the pad electrode 11 exposed at the bottom portion of the via hole 12. Alternatively, the wiring layer 13 can be formed only in the via hole 12 without extending to the back surface of the semiconductor die.

Next, a second protection layer 14 is formed over the back surface of the semiconductor substrate 10 including on the wiring layer 13. Then, a predetermined part of the second protection layer 14 is selectively removed to form an opening 14a exposing a part of the wiring layer 13 and to remove the second protection layer 14 in a region near the dicing line (not shown). Then, a conductive terminal 15 for connecting the semiconductor device to an external printed circuit board and the like is formed on the wiring layer 13 exposed at the opening 14a. It is noted that the semiconductor device of the embodiment is not necessarily of BGA type, and the conductive terminal 15 can be omitted when the semiconductor device is of LGA (land grid array) type.

Figure 5:
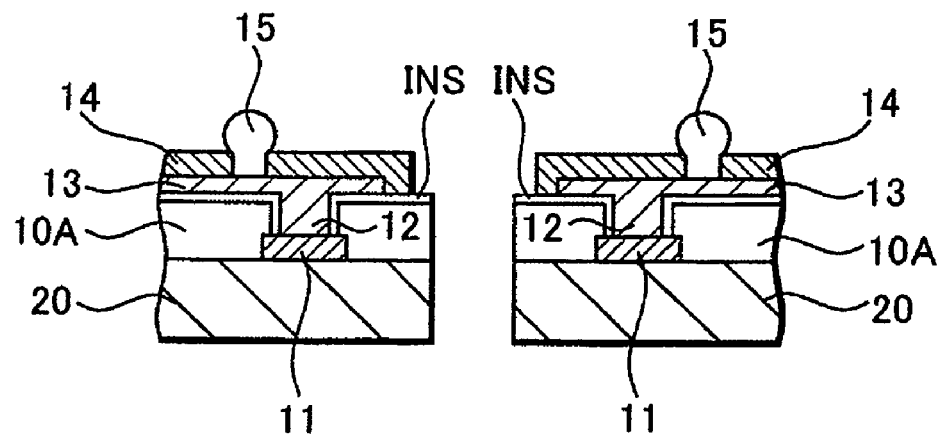
FIG. 5 is a cross-sectional view showing the semiconductor device and the manufacturing method thereof of the embodiment of the invention.
Figure 6:
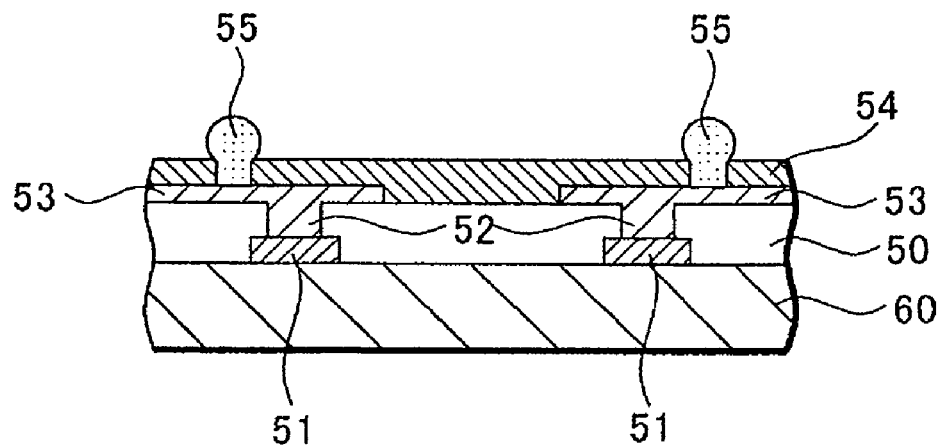
FIG. 6 is a cross-sectional view showing a manufacturing method of a semiconductor device of a conventional art.
Figure 7:
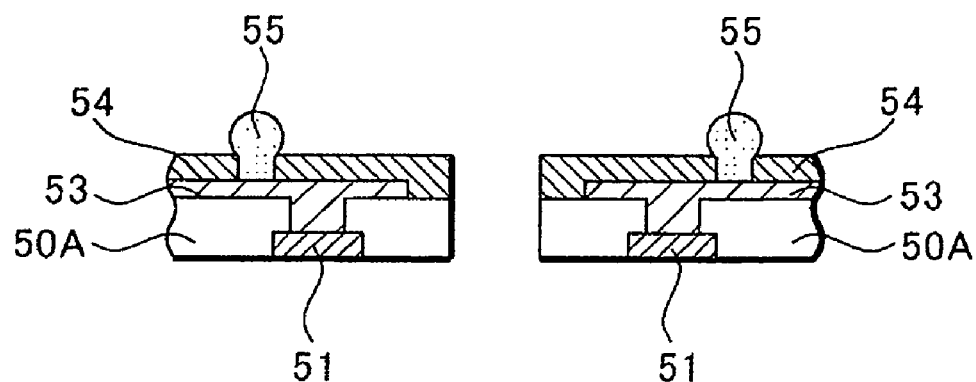
FIG. 7 is a cross-sectional view showing the semiconductor device and the manufacturing method thereof of the conventional art.

Lastly, a dicing is performed along the dicing line (not shown) and the protection tape 21 is peeled off, thereby completing package type semiconductor devices each formed of a semiconductor die 10A, as shown in FIG. 5.

In this embodiment, by forming the first protection layer 20 on the front surface of the semiconductor die 10A, the semiconductor die 10A (the semiconductor substrate 10 in the manufacturing process) can be supported and protected as described above. Particularly, in a case where the semiconductor die 10A is formed having a small thickness (e.g. 130 μm or less), the first protection layer 20 effectively functions as a support layer necessary in the backgrinding process.

Furthermore, since the first protection layer 20 has a function of protecting the semiconductor die 10A, the first protection layer 20 need not be removed in the manufacturing process. Therefore, the manufacturing process of the package type semiconductor device can be performed more simply than conventional, so that the manufacturing cost can be minimized. Furthermore, since the front surface of the semiconductor die 10A is protected by the first protection layer 20, outside moisture can be prevented from permeating the semiconductor die 10A through the front surface.

As a result, in the package type semiconductor device and the manufacturing method thereof, the reliability can be improved without making the manufacturing process complex and with minimizing the manufacturing cost.

What is claimed is:

1. A semiconductor device comprising:
   a semiconductor die having a first surface and second surface;
   a pad electrode formed on the first surface, a via hole being formed between the pad electrode and the second surface;
   a first protection layer attached to the first surface so as to cover the pad electrode;
   an insulation film disposed on an inside wall of the via hole; and
   a metal portion disposed in the via hole to be in contact with the pad electrode.

2. The semiconductor device of claim 1, further comprising a conductive terminal disposed on the metal portion.

3. The semiconductor device of claim 1, further comprising a wiring layer disposed on the second surface and connected to the metal portion.

4. The semiconductor device of claim 3, further comprising a second protection layer disposed on the second surface so as to cover the metal portion and the wiring layer and a conductive terminal disposed on the metal portion or the wiring layer through an opening formed in the second protection layer.

5. The semiconductor device of claim 1, wherein the first protection layer is made of an epoxy resin.

6. The semiconductor device of claim 3, wherein the first protection layer is made of an epoxy resin 7. The semiconductor device of claim 1, wherein the first protection layer is made of a resist material.

8. The semiconductor device of claim 3, wherein the first protection layer is made of a resist material.

* * * * *